United States Patent
Kuo

(10) Patent No.: US 10,453,498 B2
(45) Date of Patent: Oct. 22, 2019

(54) POWER RESET CIRCUIT

(71) Applicant: Quanta Computer Inc., Taoyuan (TW)

(72) Inventor: Hsin-Chih Kuo, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 120 days.

(21) Appl. No.: 15/869,558

(22) Filed: Jan. 12, 2018

(65) Prior Publication Data

US 2019/0147921 A1 May 16, 2019

(30) Foreign Application Priority Data

Nov. 15, 2017 (TW) .............................. 106139473 A

(51) Int. Cl.
| | |
|---|---|
| H02M 1/08 | (2006.01) |
| G11C 5/14 | (2006.01) |
| G11C 7/10 | (2006.01) |
| G11C 7/14 | (2006.01) |
| G11C 7/22 | (2006.01) |
| H03K 5/19 | (2006.01) |
| H02M 3/335 | (2006.01) |
| H03K 17/22 | (2006.01) |
| H02M 1/36 | (2007.01) |

(Continued)

(52) U.S. Cl.
CPC ............... *G11C 5/148* (2013.01); *G11C 7/10* (2013.01); *G11C 7/14* (2013.01); *G11C 7/22* (2013.01); *H02M 1/08* (2013.01); *H02M 3/33507* (2013.01); *H03K 5/19* (2013.01); *H03K 17/22* (2013.01); *H02M 1/36* (2013.01); *H02M 2001/0025* (2013.01); *H02M 2001/322* (2013.01)

(58) Field of Classification Search
CPC .. G11C 5/148; G11C 7/14; G11C 7/22; G11C 7/10; H02M 3/33507; H02M 1/08; H02M 2001/322; H02M 1/36; H02M 2001/0025; H03K 5/19; H03K 17/22
See application file for complete search history.

(56) References Cited

U.S. PATENT DOCUMENTS

| | | | |
|---|---|---|---|
| 9,059,585 B2 * | 6/2015 | Lee | .......................... H02H 7/16 |
| 2006/0176020 A1 * | 8/2006 | Ibrahim | ................ H02J 7/0063 320/127 |

(Continued)

*Primary Examiner* — Pinping Sun
(74) *Attorney, Agent, or Firm* — McClure, Qualey & Rodack, LLP

(57) ABSTRACT

A power reset circuit is provided. The power reset circuit has a first terminal coupled to a first power storage element and a second terminal coupled to a second power storage element and a load and includes a discharging control circuit and a switching control circuit. The discharging control circuit induces a short circuit between the second terminal and the ground terminal when a supply voltage at the second terminal is lower than a reset voltage to provide a first discharging path. The switching control circuit provides a conduction path between the first and second terminals when the supply voltage is higher than an end-of-discharging voltage lower than the reset voltage. During a period when the supply voltage is lower than the end-of-discharging voltage, the switching control circuit cuts off the conduction path and provides a second discharging path between the first terminal and the discharging control circuit.

10 Claims, 11 Drawing Sheets

(51) Int. Cl.
*H02M 1/00* (2006.01)
*H02M 1/32* (2007.01)

(56) References Cited

U.S. PATENT DOCUMENTS

| | | | | |
|---|---|---|---|---|
| 2009/0295330 A1* | 12/2009 | Li | ............... | H02J 7/0013 |
| | | | | 320/124 |
| 2012/0161714 A1* | 6/2012 | Ishibashi | ............... | H02J 7/0063 |
| | | | | 320/135 |
| 2012/0218023 A1* | 8/2012 | Trock | ............... | H03K 17/22 |
| | | | | 327/401 |
| 2016/0111909 A1* | 4/2016 | Kuo | ............... | H02J 7/0063 |
| | | | | 320/166 |
| 2016/0190845 A1* | 6/2016 | Chen | ............... | H02H 3/087 |
| | | | | 320/135 |
| 2016/0211675 A1* | 7/2016 | Joehren | ............... | H02M 3/1582 |
| 2019/0115628 A1* | 4/2019 | Ho | ............... | H01M 10/425 |

* cited by examiner

POWER RESET CIRCUIT

CROSS REFERENCE TO RELATED APPLICATIONS

This Application claims priority of Taiwan Patent Application No. 106139473, filed on Nov. 15, 2017, the entirety of which is incorporated by reference herein.

BACKGROUND OF THE INVENTION

Field of the Invention

The disclosure relates generally to a power reset circuit, and more particularly it relates to a power reset circuit which can provide a rapid discharge path.

Description of the Related Art

Generally, in cases where an electronic system is in an idle state for a period of time or unplugged and then plugged back in a short period of time, if the power is not reset completely, the function of the electronic system may become abnormal. The so-called power resetting refers to that when the system is powered off or the power is lower than a certain potential, the system power is discharged to a potential close to the zero volt to ensure that the data stored in the registers within all the elements of the system is erased. When the power of the electronic system is not discharged to the potential close the zero volt, if the power is re-supplied to the electronic system at this time, the electronic system may not be turned on or may be in an abnormal state. Therefore, a reset circuit needs to be configured to quickly pull the power supply node or path receiving the system voltage a potential close to the zero volt when the system voltage of the electronic system is lower than the reset potential, so that the power storage element connected to the power supply node or path can be discharged quickly. However, since the operating voltage of the reset circuit is supplied from the above power storage component, if the voltage of the power storage component is discharged below the minimum operating voltage, the reset circuit cannot continue to work, so that the reset circuit cannot quickly pull the power supply node or path to a potential close the zero volt.

BRIEF SUMMARY OF THE INVENTION

One embodiment of a power reset circuit is provided. The power reset circuit has a first terminal coupled to a first power storage element and further has a second terminal coupled to a second power storage element and a load. The power reset circuit comprises a discharging control circuit and a switching control circuit. The discharging control circuit is coupled to the second terminal and a ground terminal. The discharging control circuit induces a short circuit during a period when a supply voltage at the second terminal is lower than a reset voltage to provide a first discharging path. The switching control circuit is coupled to the first terminal, the second terminal, and the discharging control circuit. The switching control circuit provides a conduction path between the first terminal and the second terminal during a period when the supply voltage is higher than an end-of-discharging voltage. The end-of-discharging voltage is lower than the reset voltage. During a period when the supply voltage is lower than the end-of-discharging voltage, the switching control circuit cuts off the conduction path and provides a second discharging path between the first terminal and the discharging control circuit.

Another embodiment of a power reset circuit is provided. The power reset circuit has a first terminal coupled to a first power storage element and further has a second terminal coupled to a second power storage element and a load. The power reset circuit comprises a discharging control circuit and a switching control circuit. The discharging control circuit is coupled to the second terminal and a ground terminal. The switching control circuit is coupled to the first terminal, the second terminal, and the discharging control circuit. The switching control circuit comprises a transistor coupled between the first terminal and the second terminal. During a period when a supply voltage at the second terminal is between a reset voltage and an end-of-discharge voltage lower than the reset voltage, the switching control circuit turns on the transistor, and the discharging control circuit induces a short circuit between the second terminal and the ground terminal to provide a first discharge path, such that the first power storage element and the second power storage element are discharged via the first discharge path. During a period when the supply voltage is lower than the end-of-discharge voltage, the switching control circuit turns off the transistor and provides a second discharging path between the first terminal and the discharging control circuit.

A detailed description is given in the following embodiments with reference to the accompanying drawings.

BRIEF DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
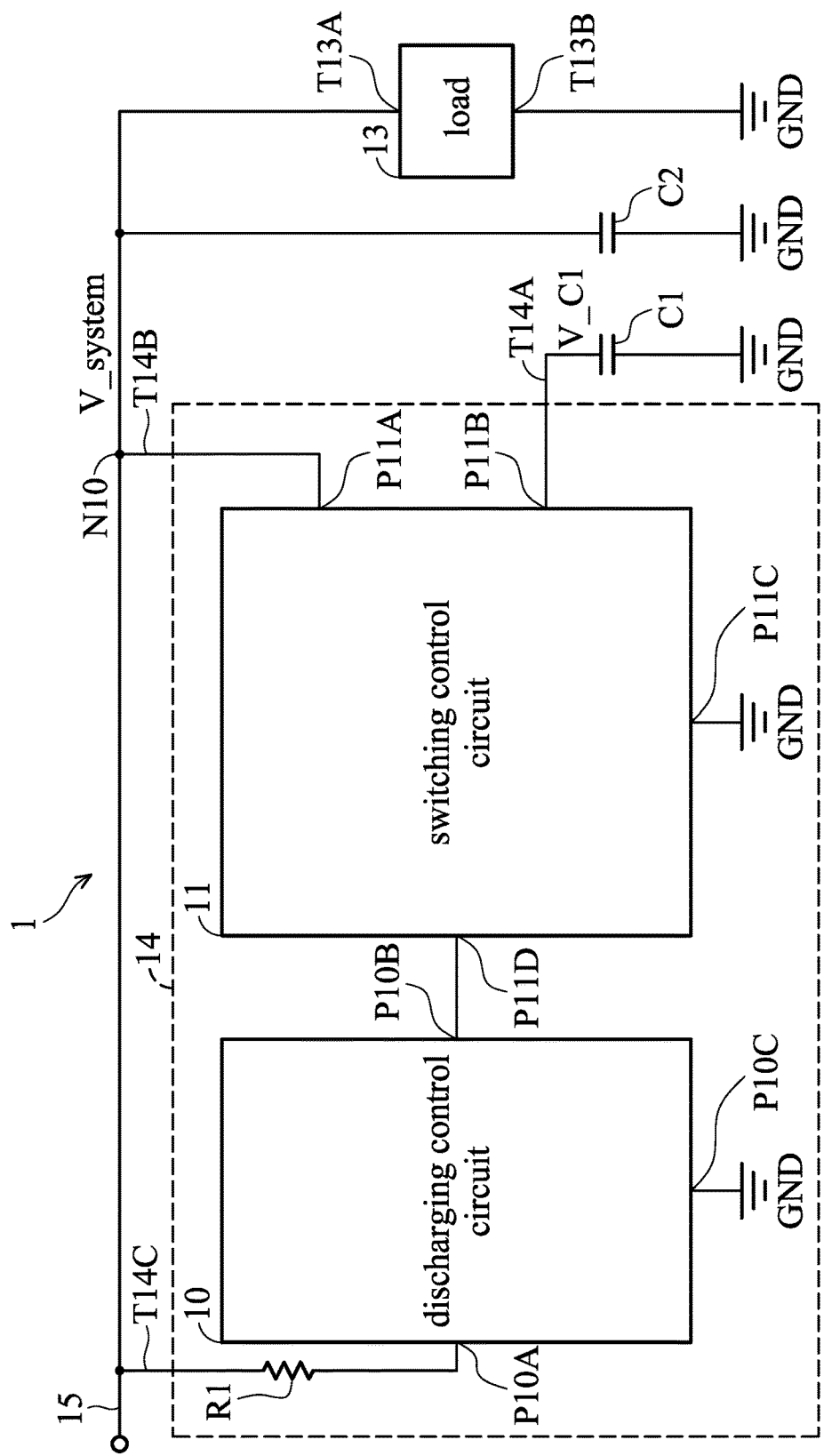
FIG. 1 shows one exemplary embodiment of an electronic system.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 shows an exemplary embodiment of an electronic system. Referring to FIG. 1, an electronic system 1 comprises a load 13, a power reset circuit 14, and power storage elements C1 and C2. In an embodiment, the power storage elements C1 and C2 are implemented as capacitors. Referring to FIG. 1, the power reset circuit 14 comprises a first terminal T14A, a second terminal T14B, and a third terminal T14C. The second terminal T14B and the third terminal T14C of the power reset circuit 14 are coupled to the node N10. In the embodiment, the second terminal T14B, the third terminal T14C, and the node N10 have the same potential. Therefore, the voltage at the second terminal T14B is equal to the supply voltage V_system at the node N10. The power storage element C1 is coupled between the first terminal T14A of the power reset circuit 14 and the ground terminal GND. One terminal of the power storage element C2 is coupled to the second terminal T14B of the power reset circuit 14 through the node N10, and the other terminal of the energy storage element C2 is coupled to the ground terminal GND. The load 13 comprises power supply terminals T13A and T13B. The power supply terminal T13A is coupled to the node N10, and the power supply terminal T13B is coupled to the ground terminal GND. The electronic system 1 is connected to a power wire 15 through the node N10. The load 13 and the power reset circuit 14 receive the supply voltage V_system at the node N10 as their operating voltages used during the operations.

In the embodiment of FIG. 1, the power reset circuit 14 comprises a discharging control circuit 10, a switching control circuit 11, and a resistor R1. The discharging control circuit 10 comprises pins P10A, P10B, and P10C, and the switching control circuit 11 comprises pins P11A, P11B, P11C, and P11D. The resistor R1 is coupled between the node N10 and the pin P10A of the discharging control circuit 10. The pin P10B of the discharging control circuit 10 is coupled to the pin P11D of the switching control circuit 11, and the pin P10C thereof is coupled to the ground terminal GND. In the embodiment, the voltage received by the pin P10B of the discharging control circuit 10 is used as the operating voltage of the discharging control circuit 10. The pin P11A of the switching control circuit 11 is coupled to the second terminal T14B of the power reset circuit 14. That is, the pin P11A is coupled to the node N10 and the power storage element C2 through the second terminal T14B. The pin P11B of the switching control circuit 11 is coupled to the first terminal T14A of the power reset circuit 14. That is, the pin P11B is coupled to the power storage device C1 through the first terminal T14A.

According to the embodiment of the present invention, when an external power is supplied to the electronic system 1 through the power wire 15, the switching control circuit 11 provides a conduction path between the pins P11A and P11B, so that the power storage element C1 is coupled to the node N10. In cases where the external power is not supplied to the electronic system 1 through the power line 15, the power storage elements C1 and C2 are discharged through the load 13 slowly, so that the supply voltage V_system at the node N10 starts dropping. When the supply voltage V_system at the node N10 is lower than a predefined reset voltage, the discharging control circuit 10 induces a short circuit between the pins P10A and P10C to provide a discharge path between the node N10 and the ground terminal GND, so that the power storage elements C1 and C2 are discharged rapidly through this discharge path, and the supply voltage V_system drops rapidly. When the supply voltage V_system drops below the end-of-discharge voltage, the switching control circuit 11 cuts off the conduction path between the pins P11A and P11B and provides a discharge path between the pin P11B and the pin P10B of the discharging control circuit 10 Accordingly, the discharging control circuit 10 can be powered by the voltage of the power storage element C1 via the discharge path and continue to operate according to the supply voltage to provide the discharge path between the node N10 and the ground terminal GND. The detailed circuit configuration and operation of the power reset circuit 14 will be described later.

Figure 2:
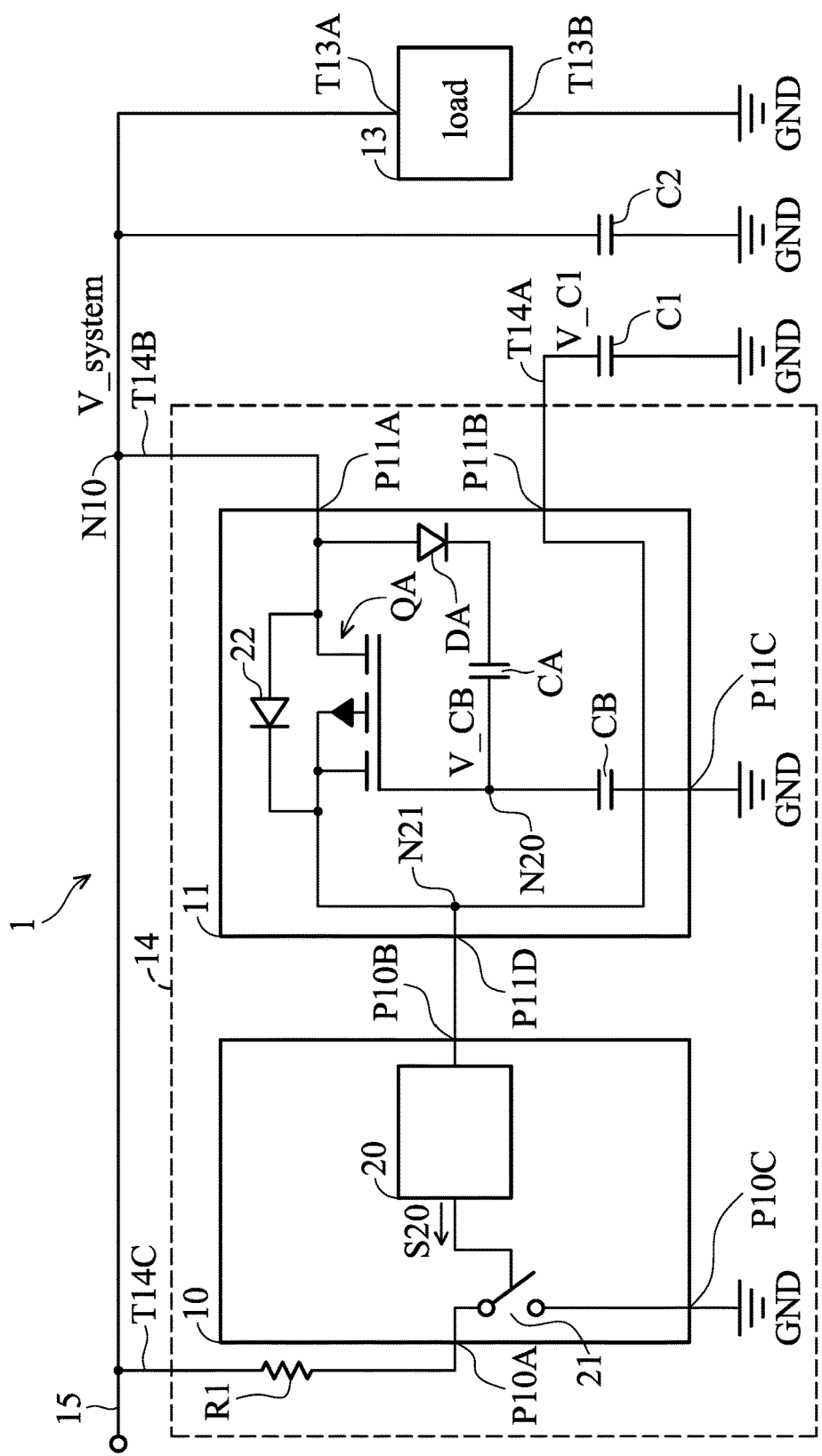
FIG. 2 shows another exemplary embodiment of an electronic system.

Referring to FIG. 2, the discharging control circuit 10 comprises a determination circuit 20 and a switch 21. As described above, the voltage at the pin P10B of the discharging control circuit 10 serves as its operating voltage. In the embodiment of the present invention, the determination circuit 20 determines whether the voltage at the pin P10B (ie, the operating voltage thereof) is lower than the reset voltage and generates a control signal S20 according to the determination result. The switch 21 is coupled between the pins P10A and P10C. The determination circuit 20 controls the on/off state of the switch 21 through the control signal S20, in other words, the determination circuit 20 turns the switch 21 on or off by the control signal S20. When the determination circuit 20 determines that the voltage at the pin P10B is lower than the reset voltage, the switch 21 is turned on according to the control signal S20. At this time, there is a short circuit between the pins P10A and P10C, and a discharge path is formed between the node N10 and the ground terminal GND. When the determination circuit 20 determines that the voltage at the pin P10B is not lower than the reset voltage, the switch 21 is turned off according to the control signal S20. At this time, there is an open circuit between the pin P10A and the pin P10C are open, so that the discharge path between the node N10 and the ground terminal GND is cut off.

The switching control circuit 11 comprises a transistor QA, a diode DA, and capacitors CA and CB. In the embodiment, the transistor QA is implemented as a P-type transistor. Referring to FIG. 2, the control electrode (gate) of transistor QA is coupled to a node N20. The first electrode (source) of the transistor QA is coupled to the node N21 and further to the pins P11B and P11D through the node N21. Because the pin P11B is coupled to the first terminal T14A of the power reset circuit 14, the first electrode of the transistor QA is also coupled to the first terminal T14A and the power storage element C1. The second electrode (drain) of the transistor QA is coupled to the pin P11A. Since the pin P11A is coupled to the second terminal T14B of the power reset circuit 14, the second electrode of the transistor QA is also coupled to the second terminal T14B and the node N10. The anode of diode DA is coupled to the pin P11A and coupled to node N10 through the pin P11A. The capacitor CA is coupled between the cathode of the diode DA and the node N20. The capacitor CB is coupled between the node N20 and the ground terminal GND.

According to the circuit structure of the switching control circuit 11, the on/off state of the transistor QA is controlled by the voltage V_CB at the node N20 and the voltage V_C1 at the node N21 (that is, the voltage of the power storage element C1). The voltage V_CB is determined according to the supply voltage V_system at the second terminal T14B, the capacitance values of the capacitors CA and CB, and the junction voltage of the diode DA. When the electronic system 1 stably receives the external voltage through the power wire 15 as the supply voltage V_system, the voltage V_CB has a fixed level based on the voltage dividing operation of the capacitors CA and CB. When the electronic system 1 does not receive the external voltage through the power wire 15, the voltage V_CB is maintained at a fixed level based on the charge-storing characteristic of the capacitor CA. According to the general characteristic of the transistor, when the voltage at the node N21 is greater than the sum of the threshold voltage $QA\_V_{GS\_th}$ of the transistor QA and the voltage V_CB (QA_$V_{GS\_th}$+V_CB), the transistor QA is turned on. When the voltage at the node N21 is smaller than the threshold of the transistor QA When the sum of the voltage QA_$V_{GS\_th}$ and the voltage V_CB (QA_$V_{GS\_th}$+V_CB), the transistor QA is turned off. In the embodiment of the present invention, the sum of the critical voltage QA_$V_{GS\_th}$ of the transistor QA and the voltage V_CB (QA_$V_{GS\_th}$+V_CB) is defined as the end-of-discharge voltage used by the switching control circuit 11. Therefore, it can be seen that the adjustment of the end-of discharge voltage in the embodiment of the present invention can be achieved by changing the threshold voltage QA_$V_{GS\_th}$ of the transistor QA and/or changing the capacitance value of the capacitor CA.

Figure 3:
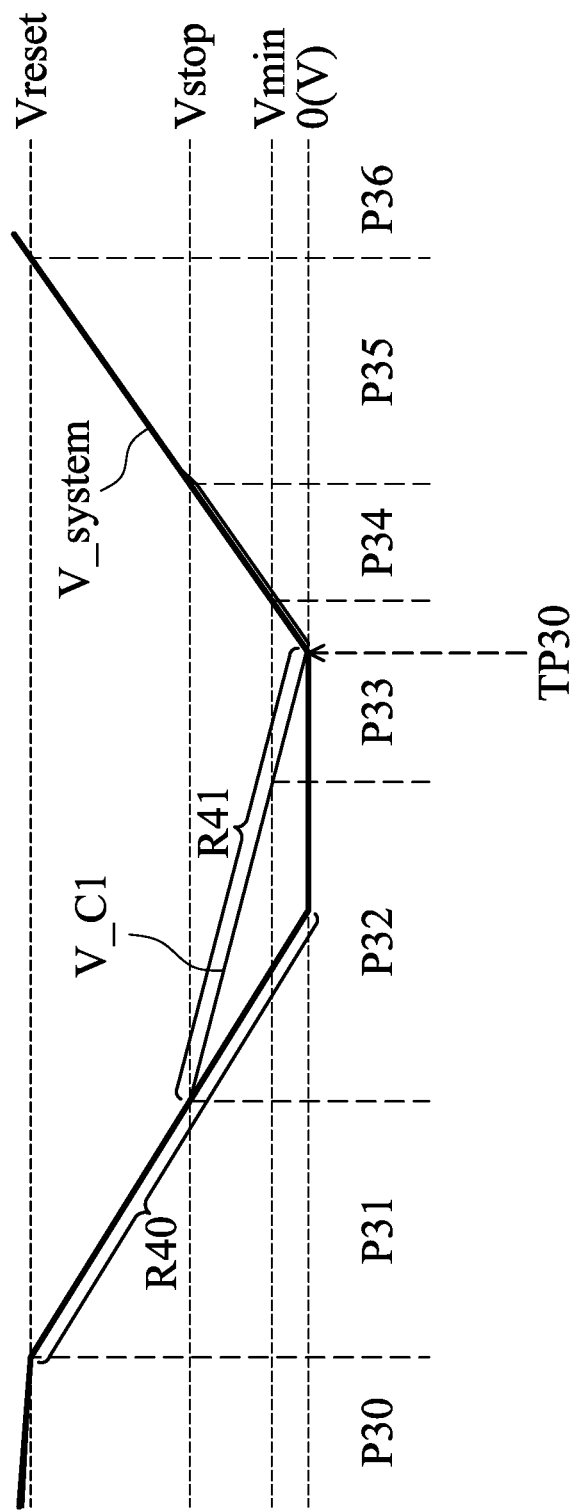
FIG. 3 is a schematic diagram showing voltage changes of power storage elements in an electronic system according to an exemplary embodiment.

According to the above description, the power reset circuit 14 defines the reset voltage used by the discharging control circuit 10 and the end-of-discharge voltage used by the switching control circuit 11. The power reset circuit 14 further defines a minimum operating voltage, which is a minimum voltage that allows the discharging control circuit 10 to operate. According to the embodiment of the present invention, as shown in FIG. 3, the end-of-discharge voltage Vstop is lower than the reset voltage Vreset, and the minimum operating voltage Vmin is lower than the reset voltage Vreset. The operation of the power reset circuit 14 will be described below with reference to FIGS. 3 and 4A-4H.

Referring to FIGS. 4A-4H, the electronic system 1 can be selectively connected to a power source 40. The power source 40 may be a device that can provide power, such as a power converter, a battery, or the like. In FIGS. 4A-4G, the switch 41 is coupled between the power source 40 and the power wire 15. In some embodiments, the switch 41 may be a physical switch element whose on/off state determines whether the electronic system 1 receives the external voltage VIN from the power source 40. In other embodiments, the switch 41 is a non-physical switch element, which is only used to indicate the case where the electronic system 1 receives/does not receive the external voltage VIN. The turned-on state of the switch 41 indicates that the electronic system 1 receives the external voltage VIN. The turned-off state of the switch 41 indicates that the electronic system 1 does not receive the external voltage VIN.

Figure 4A:
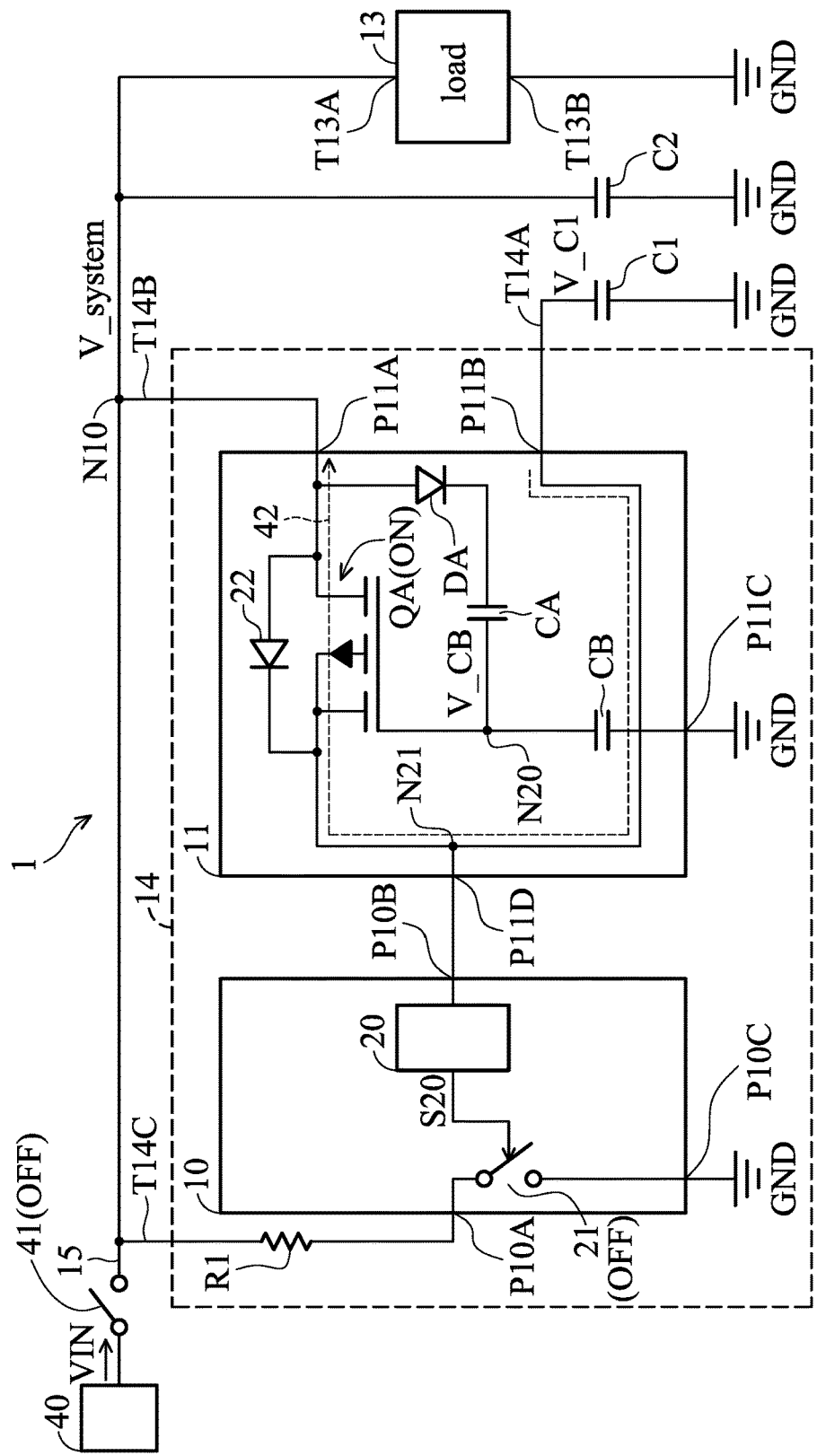
FIGS. 4A-4H are schematic diagrams illustrating an operation of an electronic system when receiving an external voltage and not receiving an external voltage according to an exemplary embodiment.

Referring to FIG. 4A, it is assumed that the electronic device 1 becomes not to receive the external voltage VIN (the switch 41 is turned off) after the electronic device 1 receives the external voltage VIN through the power wire 15 for a period of time. As shown in FIG. 4A, since the power storage element C2 is discharged through the load 13, the supply voltage V_system of the second terminal T14B (the node N10) starts dropping gradually (referring to the period P30 in FIG. 3). At this time, the transistor QA is turned on (ON), thereby providing a conduction path 42 between the pins P11A and P11B. During the period P30, the voltage V_C1 of the power storage element C1 is equal to the supply voltage V_system through the conduction path 42. The power storage element C1 is discharged through the load 13 via the conduction path 42, so that the voltage V_C1 starts dropping gradually with the supply voltage V_system. In addition, since the transistor QA is turned on (ON), the voltage at the pin P10B is equal to the supply voltage V_system. The determination circuit 20 can determine whether the supply voltage V_system is lower than the reset voltage Vreset by determining whether the voltage at the pin P10B is lower than the reset voltage Vreset. During the period P30, when the determination circuit 20 determines that the voltage at the pin P10B is not lower than the reset voltage Vreset, the switch 21 is turned off by the control signal S20, so that there is no discharging path between the node N10 and the ground terminal GND.

Figure 4B:
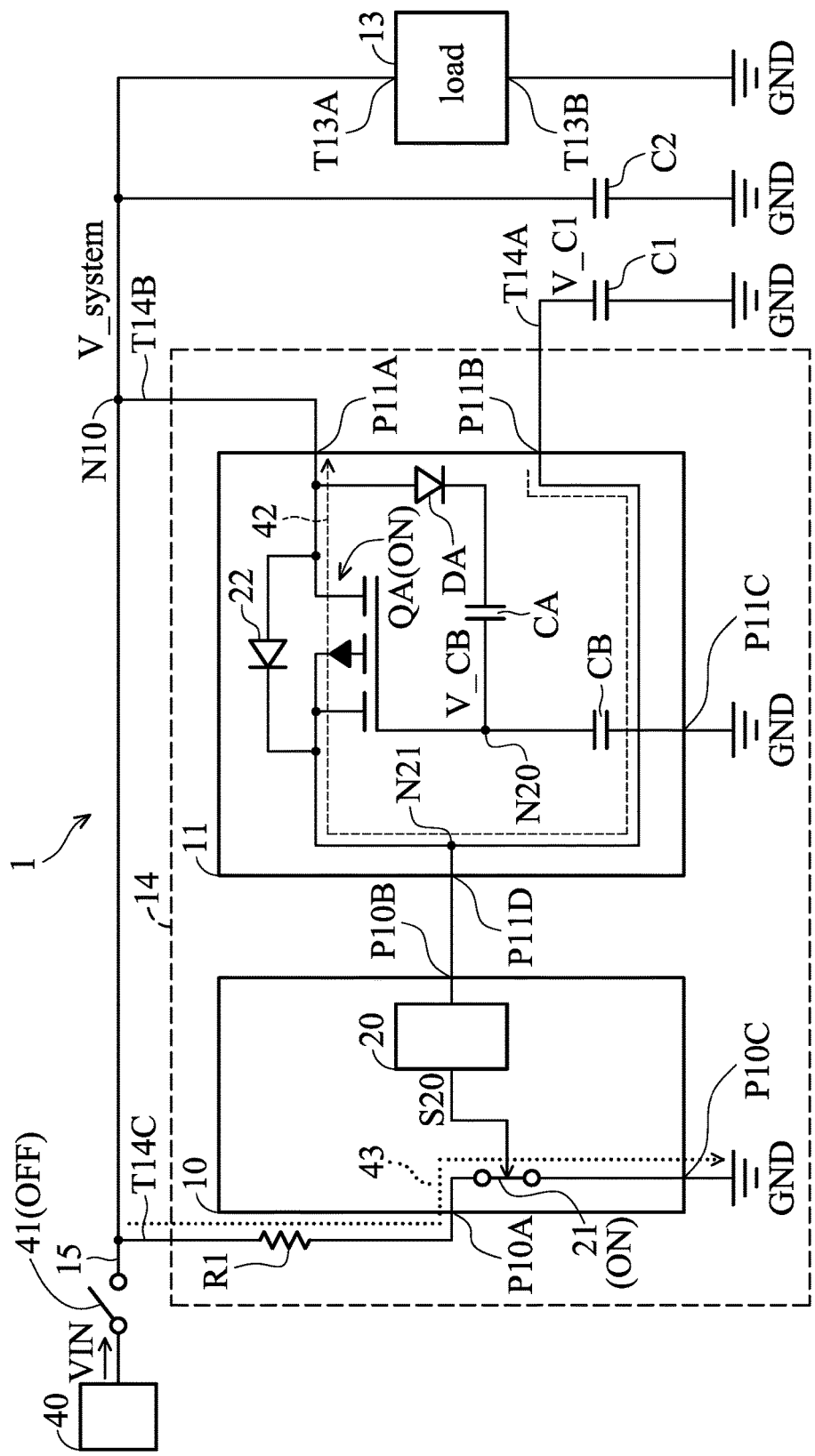
Figure 4C:
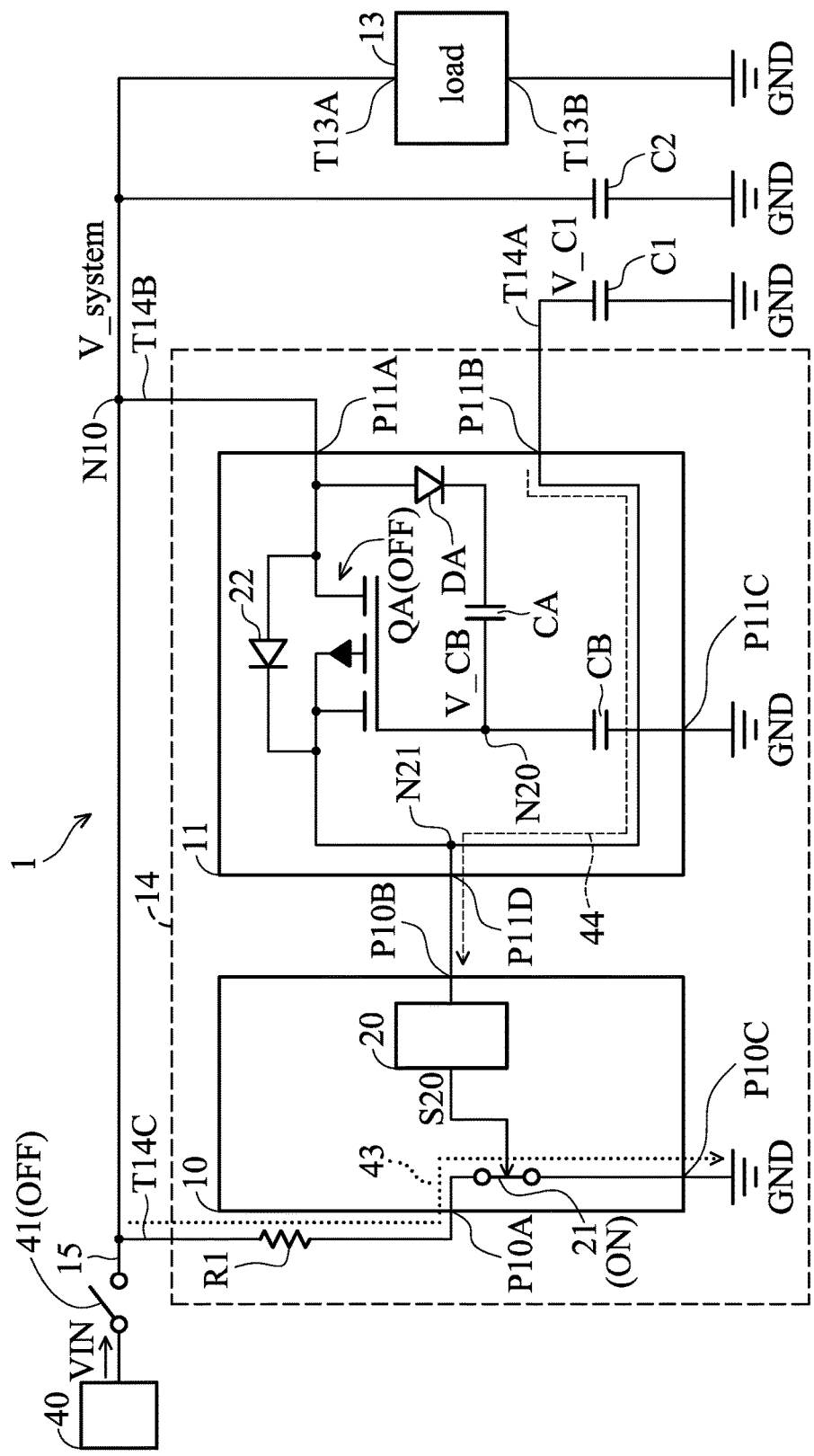

Referring to FIG. 3, during a period when the supply voltage V_system on the second terminal T14B drops gradually, when the determination circuit 20 determines that the voltage at the pin P10B (which is equal to the supply voltage V_system) is lower than the reset voltage Vreset, the determination circuit 20 turns on the switch 21 through the control signal S20, such that a discharge path 43 is formed between the node N10 and the ground terminal GND, as shown in FIG. 4B. As a result, during the period P31 following the period P30, the electronic system 1 enters the fast discharging mode. In the fast discharging mode, the power storage component C2 is discharged through the resistor R1 via the discharge path 43, and the power storage component C1 is discharged through the resistor R1 via the conduction path 42 and the discharge path 43, so that the supply voltage V_system and the voltage V_C1 drop quickly at the discharge rate R40.

Referring to FIGSs 3 and 4C, when the supply voltage V_system drops below the end-of-discharge voltage Vstop (QA_$V_{GS\_th}$+V_CB) (period P32), the transistor QA is turned off (OFF) to cut off the conduction path 42 shown in FIGS. 4A-4B. At this time, another discharge path 44 is formed between the pin P11B and the pin P10B of the discharging control circuit 10, and the discharging control circuit 10 receives the voltage V_C1 of the power storage element C1 via the discharge path 44 as its operating voltage. Due to the providing the power to the discharging control circuit 10, the voltage V_C1 becomes to drop at the discharge speed R41. In the period P32, the voltage at the pin P10B is equal to the voltage V_C1 and is still lower than the reset voltage Vreset, and therefore the determination circuit 20 continuously turns on the switch 21 (ON) through the control signal S20 to continuously provide the discharge path 43. As a result, the supply voltage V_system rapidly drops to the zero potential (0V) at the discharge speed R40 and is maintained at the zero potential until the electronic device 1 receives an external voltage through the power wire 15. According to the embodiment of the present invention, the discharge rate R40 is greater than the discharge rate R41, that is, the falling slope occurred when a voltage is discharged at the discharge rate R40 is greater than the falling slope occurred when discharging at the voltage at the discharge rate R41.

Figure 4D:
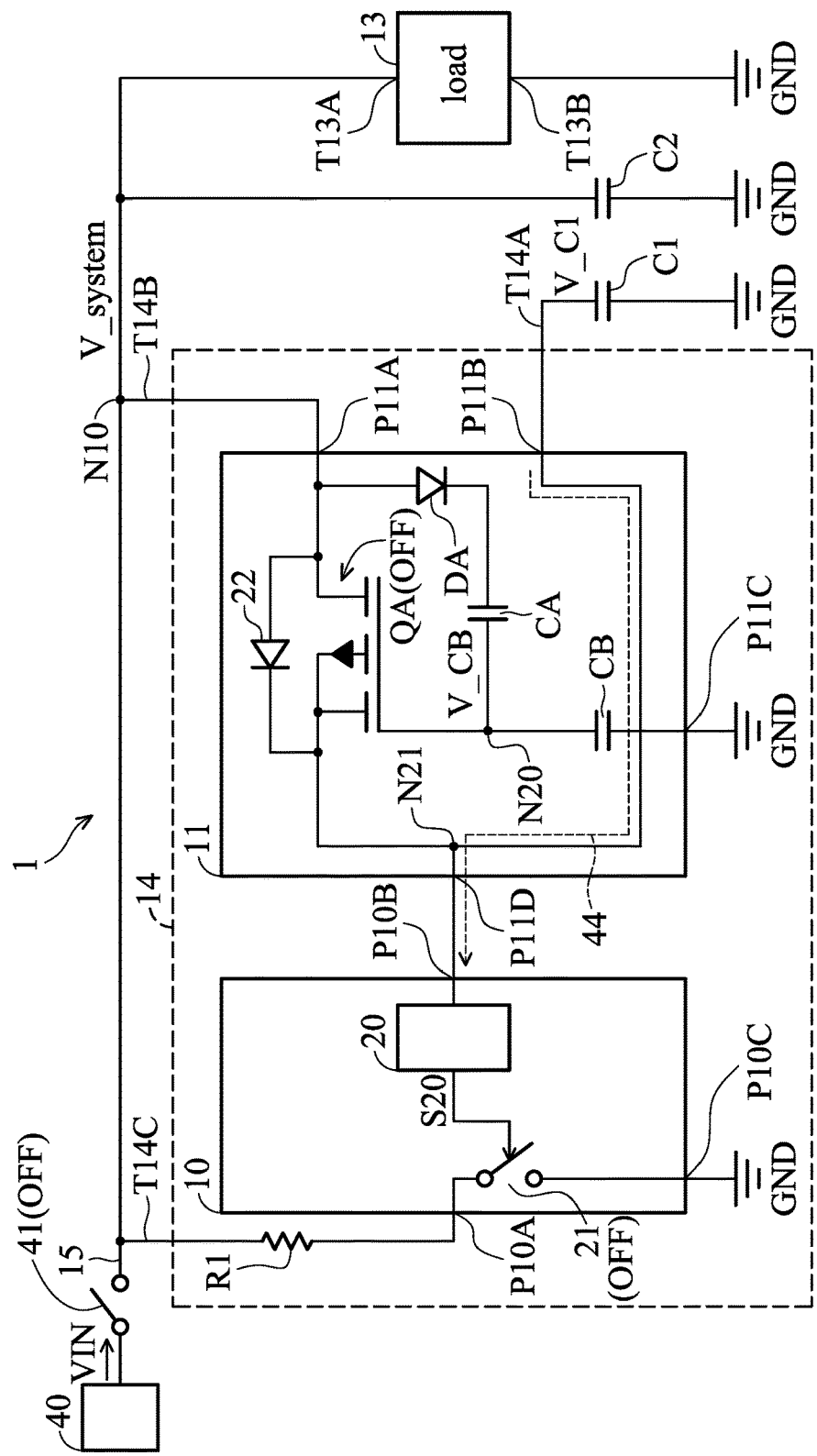

Referring to FIGS. 3 and 4D, when the voltage V_C1 continuously drops at the discharge rate R41 and falls below the minimum operating voltage Vmin of the discharging control circuit 10, the discharging control circuit 10 stops operating, so that the switch 21 is turned off (OFF) to cut off the discharge path 43. In the period P33, the power storage element C1 is discharged continuously through the discharge path 44, and the voltage V_C1 drops to the zero potential (0V) eventually.

Figure 4E:
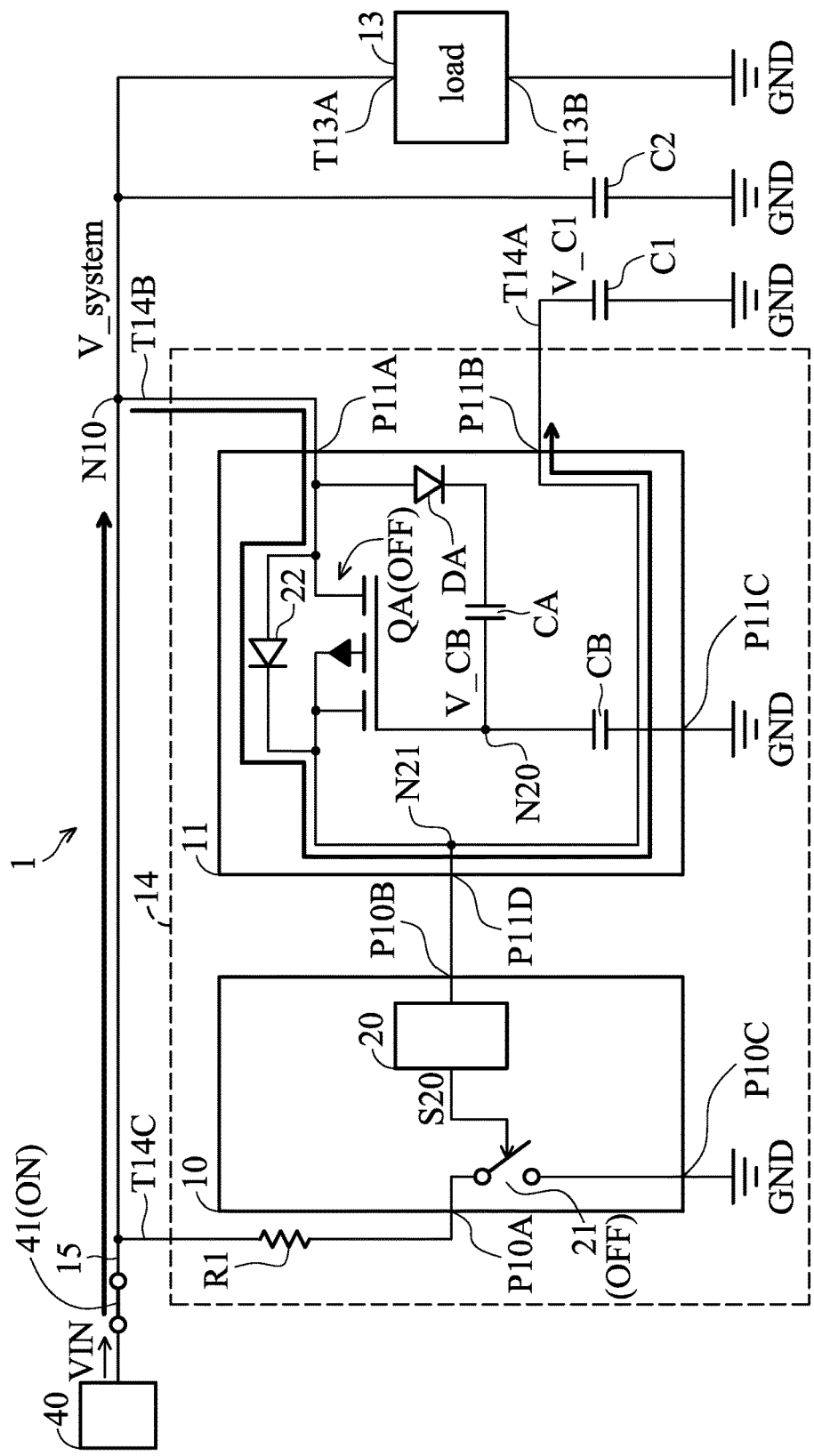
Figure 4F:
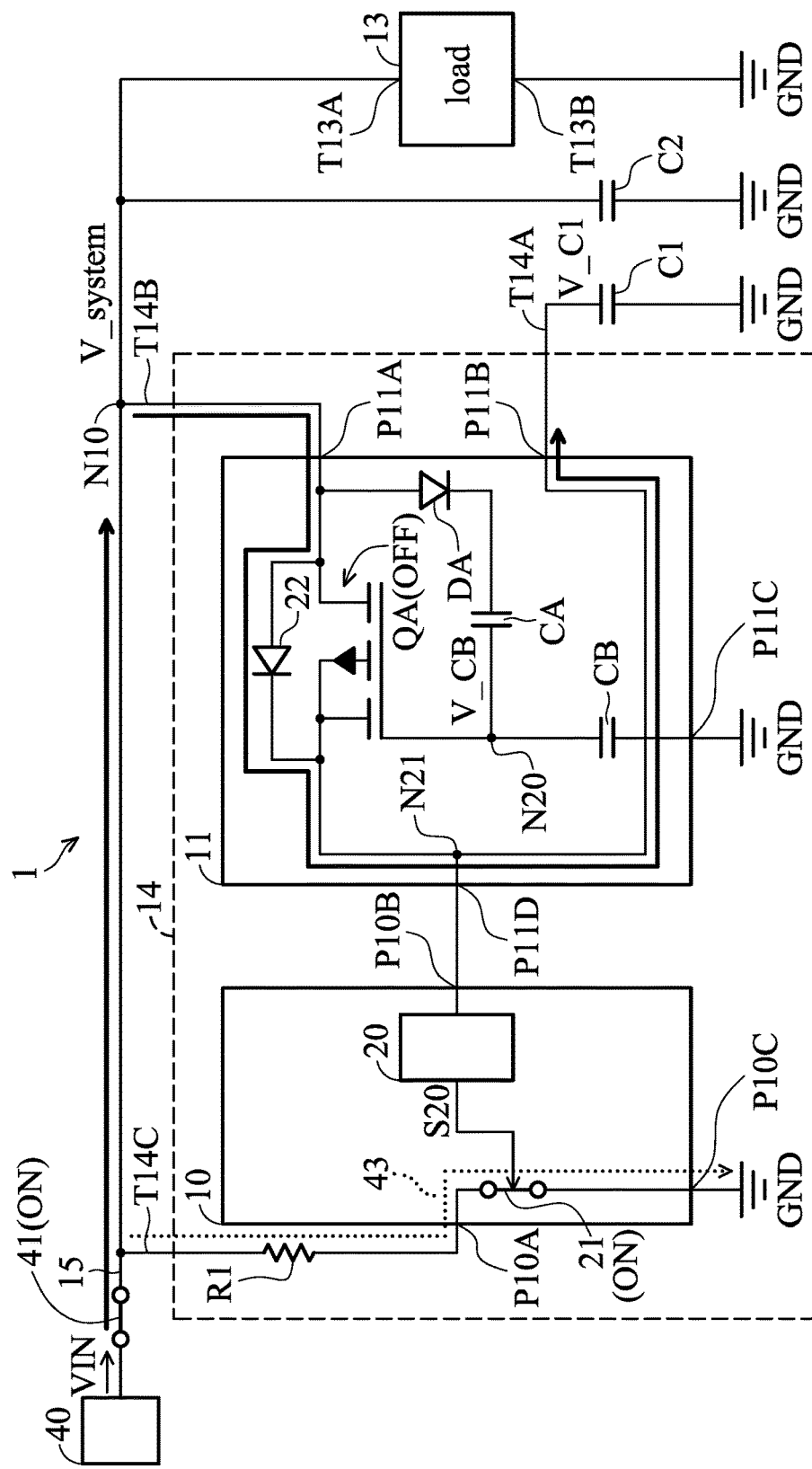

It is assumed that after the supply voltage V_system drops to the zero potential, the electronic device 1 receives the external voltage VIN again through the power wire 15 (the switch 41 is turned on) at the time point TP30, as shown in FIG. 4E. At this time, the external voltage VIN charges the power storage element C2 directly, so that the supply voltage V_system starts rising gradually toward the potential of the input voltage VIN from the zero potential. In addition, the voltage V_C1 rises with the supply voltage V_system. In detail, the transistor QA is turned off, and the external voltage VIN charges the power storage element C1 through the back-connected diode 22 of the transistor QA. Therefore, the voltage V_C1 is equal to the supply voltage V_system minus the voltage drop of the back-connected diode 22 of the transistor QA. Referring to FIGS. 3 and 4F, when the voltage V_C1 rises above the minimum operating voltage Vmin (period P34) the discharging control circuit 10 powered by the voltage V_C1 starts operating. Since the voltage at the pin P10B is equal to the voltage V_C1 and lower than the reset voltage Vreset, the decision circuit 20 controls the signal S20 to turn on the switch 21 (ON) to form the discharge path 43.

Figure 4G:
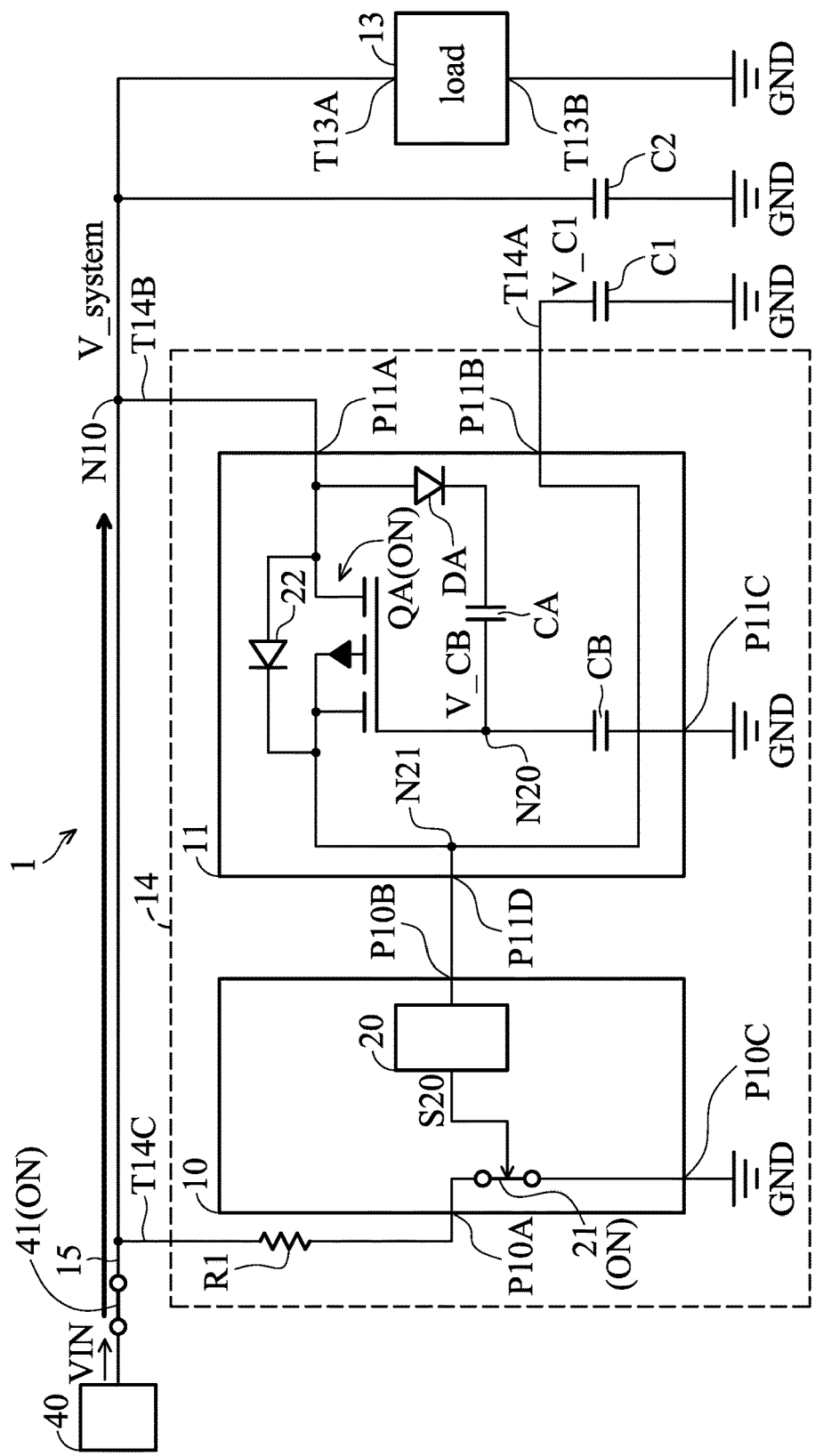
Figure 4H:
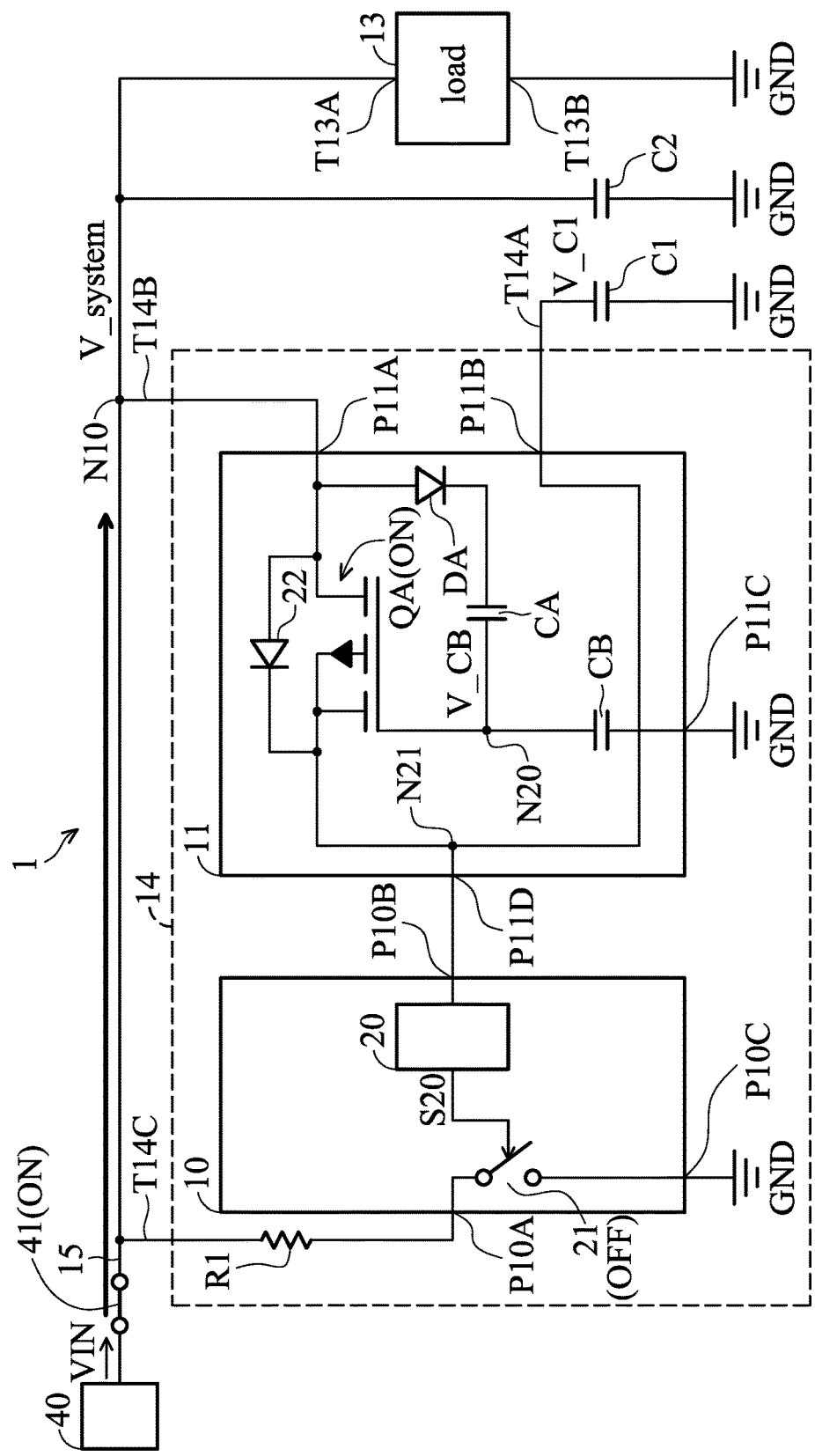

The supply voltage V_system and the voltage V_C1 continuously rise. Referring to FIGS. 3 and 4G, when the voltage V_C1 is higher than the end-of-discharge voltage Vstop (QA_$V_{GS\_th}$+V_CB) (period P35), the transistor QA is turned on (ON). In this way, the external voltage VIN charges the power storage element C1 directly, and the voltage V_C1 and the voltage at the pin P10B are equal to the supply voltage V_system. Referring to FIGS. 3 and 4H, during the period when the supply voltage V_system rises, when the determination circuit 20 determines that the voltage at the pin P10B (being equal to the supply voltage V_system at this time) is higher than the reset voltage Vreset (period P36), the determination circuit 20 turns off the switch 21 (OFF) through the control signal S20 to cut off the discharge path between the node N10 and the ground terminal GND, that is, the path 43, so as to cause the electronic system 1 to leave the fast discharging mode. At this time, the external voltage VIN continuously charges the power storage elements C1 and C2, so that the supply voltage V_system rises toward the level of the external voltage VIN.

According to the above embodiments, in cases where the electronic device 1 does not receive the external voltage VIN, when the supply voltage V_system is lower than the reset voltage Vrese, the electronic system 1 enters the fast-discharging mode. In the fast discharging mode, the discharging control circuit 10 provides the discharge path 43 and the switching control circuit 11 provides the conduction path 42. In this way, the power storage components C1 and C2 can be rapidly discharged through the resistor R1, and the supply voltage V_system can drop quickly. In addition, in the fast discharging mode, the discharging control circuit 10 can be supplied with a sufficient operating voltage to continuously provide the discharging circuit 43, so that the supplying voltage V_system can rapidly and completely drop to the zero potential. According to the above, through the power reset circuit of the embodiments of the present invention, when the electronic system 1 is powered off, the supply voltage V_system can rapidly and completely drop to the zero potential to achieve the power resetting, thereby avoiding the system abnormality induced when the power reset is not completed in the prior art.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A power reset circuit having a first terminal coupled to a first power storage element and further having a second terminal coupled to a second power storage element and a load, the power reset circuit comprising:
    a discharging control circuit, coupled to the second terminal and a ground terminal, inducing a short circuit between the second terminal and the ground terminal during a period when a supply voltage at the second terminal is lower than a reset voltage to provide a first discharging path; and
    a switching control circuit, coupled to the first terminal, the second terminal, and the discharging control circuit, providing a conduction path between the first terminal and the second terminal during a period when the supply voltage at the second terminal is higher than an end-of-discharging voltage,
    wherein the end-of-discharging voltage is lower than the reset voltage, and
    wherein during a period when the supply voltage at the second terminal is lower than the end-of-discharging voltage, the switching control circuit cuts off the conduction path and provides a second discharging path between the first terminal and the discharging control circuit.

2. The power reset circuit of claim 1, wherein the switching control circuit comprises:
    a transistor having a control electrode coupled to a first node, a first electrode coupled to the first terminal at a second node, and a second electrode coupled to the second terminal;
    a diode having an anode coupled to the second terminal and a cathode;
    a first capacitor coupled between the cathode of the diode and the first node; and
    a second capacitor coupled between the first node and the ground terminal.

3. The power reset circuit of claim 2, wherein during the period when the supply voltage at the second terminal is higher than the end-of-discharging voltage, the transistor is turned on to provide the conduction path.

4. The power reset circuit of claim 3,
    wherein the discharging control circuit is coupled to the second node, and
    wherein when the transistor is turned on, the discharging control circuit determines whether the supply voltage at the second terminal is lower than the reset voltage to determine whether to provide the first discharge path.

5. The power reset circuit of claim 4, wherein when the discharging control circuit determines that the supply voltage at the second terminal is lower than the reset voltage, the discharging control circuit provides the first discharge path.

6. A power reset circuit having a first terminal coupled to a first power storage element and further having a second terminal coupled to a second power storage element and a load, the power reset circuit comprising:
    a discharging control circuit, coupled to the second terminal and a ground terminal; and
    a switching control circuit, coupled to the first terminal, the second terminal, and the discharging control circuit, comprising a transistor coupled between the first terminal and the second terminal,
    wherein during a period when a supply voltage at the second terminal is between a reset voltage and an end-of-discharge voltage lower than the reset voltage, the switching control circuit turns on the transistor, and the discharging control circuit induces a short circuit between the second terminal and the ground terminal to provide a first discharge path, such that the first power storage element and the second power storage element are discharged via the first discharge path, and
    wherein during a period when the supply voltage at the second terminal is lower than the end-of-discharge voltage, the switching control circuit turns off the transistor and provides a second discharging path between the first terminal and the discharging control circuit.

7. The power reset circuit of claim 6, wherein the switching control circuit comprises:
   a diode having an anode coupled to the second terminal and a cathode;
   a first capacitor having a first terminal coupled to the cathode of the diode and a second terminal coupled to a control electrode of the transistor at a first node; and
   a second capacitor coupled between the first node and the ground terminal.

8. The power reset circuit of claim 7, wherein the end-of-discharge voltage is adjusted according to a threshold of the transistor and a capacitance value of at least one of the first and second capacitors.

9. The power reset circuit of claim 6, wherein a pin of the discharging control circuit is coupled to the transistor and the first terminal, and the discharging control circuit comprises:
   a determination circuit, coupled to the pin of the discharging control circuit, determining whether a voltage at the pin of the discharging control circuit is lower than the reset voltage to generate a control signal; and
   a switch coupled between the second terminal and the ground terminal and controlled by the control signal.

10. The power reset circuit of claim 9, wherein when the determination circuit determines that the voltage at the pin of the discharging control circuit is lower than the reset voltage, the switch is turned on according to the control signal.

* * * * *